United States Patent
Sato

(10) Patent No.: US 11,610,772 B2
(45) Date of Patent: *Mar. 21, 2023

(54) SUBSTRATE CLEANING METHOD AND SUBSTRATE CLEANING APPARATUS

(71) Applicant: SCREEN Holdings Co., Ltd., Kyoto (JP)

(72) Inventor: Masanobu Sato, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 247 days.

This patent is subject to a terminal disclaimer.

(21) Appl. No.: 17/080,721

(22) Filed: Oct. 26, 2020

(65) Prior Publication Data

US 2021/0043441 A1 Feb. 11, 2021

Related U.S. Application Data

(60) Division of application No. 16/881,015, filed on May 22, 2020, now Pat. No. 10,854,443, which is a
(Continued)

(30) Foreign Application Priority Data

Aug. 29, 2008 (JP) ................. 2008-221157

(51) Int. Cl.
*H01L 21/02* (2006.01)
*H01L 21/67* (2006.01)

(52) U.S. Cl.
CPC .. *H01L 21/02057* (2013.01); *H01L 21/67051* (2013.01)

(58) Field of Classification Search
CPC ......... H01L 21/02041; H01L 21/02057; H01L 21/67051; H01L 21/6708; B08B 3/12;
(Continued)

(56) References Cited

U.S. PATENT DOCUMENTS

| 4,027,686 A | 6/1977 | Shortes |
| 5,459,699 A | 10/1995 | Walter |

(Continued)

FOREIGN PATENT DOCUMENTS

| EP | 1908535 | 4/2008 |
| JP | 05-217985 | 8/1993 |

(Continued)

OTHER PUBLICATIONS

Japanese Office Action dated Mar. 4, 2014 received from Japanese Patent Office in connection with corresponding Japanese application No. 2013-092248 and English translation thereof.

(Continued)

*Primary Examiner* — Marc Lorenzi
(74) *Attorney, Agent, or Firm* — Ostrolenk Faber LLP

(57) ABSTRACT

A valve is closed while a cleaning liquid is fed into a tubular body of a cleaning nozzle, and a piezoelectric element applies vibrations to the cleaning liquid. This causes droplets of the cleaning liquid to be produced and discharged from a plurality of discharge holes. The droplet diameter of the discharged droplets is in the range from 15 to 200 μm, and the distribution of the droplet diameter is such that the value of where a value of 3σ does not exceed 10% of the average droplet diameter. The droplet speed is in the range from 20 to 100 meters per second, and the distribution of the droplet speed is such that the value of where a value of 3σ does not exceed 10% of the average droplet speed. The droplet flow rate is not less than 10 milliliters per minute. Discharging the droplets of the cleaning liquid from the cleaning nozzle toward a substrate while satisfying these discharge conditions improves cleaning efficiency without damages to the substrate.

4 Claims, 14 Drawing Sheets

Related U.S. Application Data continuation of application No. 13/965,285, filed on Aug. 13, 2013, now Pat. No. 10,699,894, which is a division of application No. 12/936,427, filed as application No. PCT/JP2009/062968 on Jul. 17, 2009, now abandoned.

(58) Field of Classification Search
CPC ....... B05B 9/00; B05B 17/06; B05B 17/0607; B05B 17/0638; B05B 17/0646
See application file for complete search history.

(56) References Cited

U.S. PATENT DOCUMENTS

| | | | |
|---|---|---|---|
| 5,823,428 | A | 10/1998 | Humberstone |
| 5,934,566 | A | 8/1999 | Kanno |
| 5,941,859 | A | 8/1999 | Lerman |
| 5,968,285 | A | 10/1999 | Farrell et al. |
| 6,048,409 | A | 4/2000 | Kanno |
| 6,284,043 | B1 | 9/2001 | Takekuma |
| 6,962,007 | B1 | 11/2005 | Maeda |
| 2003/0176029 | A1 | 9/2003 | Sugimoto |
| 2003/0183167 | A1 | 10/2003 | Kitazawa |
| 2004/0065540 | A1 | 4/2004 | Mayer |
| 2006/0283485 | A1 | 12/2006 | Sugimoto |
| 2007/0246081 | A1 | 10/2007 | Lu et al. |
| 2007/0267047 | A1 | 11/2007 | Hori |
| 2008/0107935 | A1 | 5/2008 | Degertekin |

FOREIGN PATENT DOCUMENTS

| | | |
|---|---|---|
| JP | 7-7164 | 1/1995 |
| JP | 08-252497 | 10/1996 |
| JP | 2000-000533 | 1/2000 |
| JP | 2000-133626 | 5/2000 |
| JP | 2002-011419 | 1/2002 |
| JP | 2002-11419 | 1/2002 |
| JP | 2002-110624 | 4/2002 |
| JP | 2003-517917 | 6/2003 |
| JP | 2003-283103 | 10/2003 |
| JP | 3504023 | 12/2003 |
| JP | 2004-179323 | 6/2004 |
| JP | 2004-327487 | 11/2004 |
| JP | 2005-044866 | 2/2005 |
| JP | 3659593 | 6/2005 |
| JP | 2005-266534 | 9/2005 |
| JP | 2006-128332 | 5/2006 |
| JP | 2007-027270 | 2/2007 |
| JP | 2007-194654 | 8/2007 |
| JP | 2007-227878 | 9/2007 |
| JP | 2007-237157 | 9/2007 |
| JP | 2007-324359 | 12/2007 |
| JP | 2009-530865 | 8/2009 |
| KR | 10-1999-013579 | 2/1999 |
| WO | WO 2007-111976 | 10/2007 |

OTHER PUBLICATIONS

International Search Report dated Sep. 29, 2009 in corresponding PCT International Application No. PCT/JP2009/062968.
Korean Office Action received from the Korean Patent Office dated Oct. 24, 2011 for corresponding Korean application No. 10-2010-7021579.
Japanese translation of Korean Office Action and English translation of Japanese translation of Korean Office Action.
Korean Office Action received from the Korean Patent Office dated Apr. 16, 2012 for corresponding Korean application No. 10-2010-7021579.
Korean Office Action received from the Korean Patent Office dated Apr. 18, 2012 for corresponding Korean application No. 10-2012-7001709.
Office Action issued by the Japanese Patent Office dated Oct. 2, 2012 in connection with corresponding Japanese Patent Application No. 2008-221157.
Translation of the Office Action issued by the Japanese Patent Office dated Oct. 2, 2012 in connection with corresponding Japanese Patent Application No. 2008-221157.
Office Action issued by Korean Patent Office dated Nov. 30, 2012 in connection with corresponding Korean Patent Application No. 10-2010-7021579 with Japanese and English Translation thereof.
Office Action issued by Korean Patent Office dated Nov. 28, 2012 in connection with corresponding Korean Patent Application No. 10-2012-7001709 with Japanese and English Translation thereof.
Office Action issued by Korean Patent Office dated Feb. 4, 2013 in connection with corresponding Korean Patent Application No. 10-2010-7021579 with Japanese and English Translation thereof.

F I G . 5
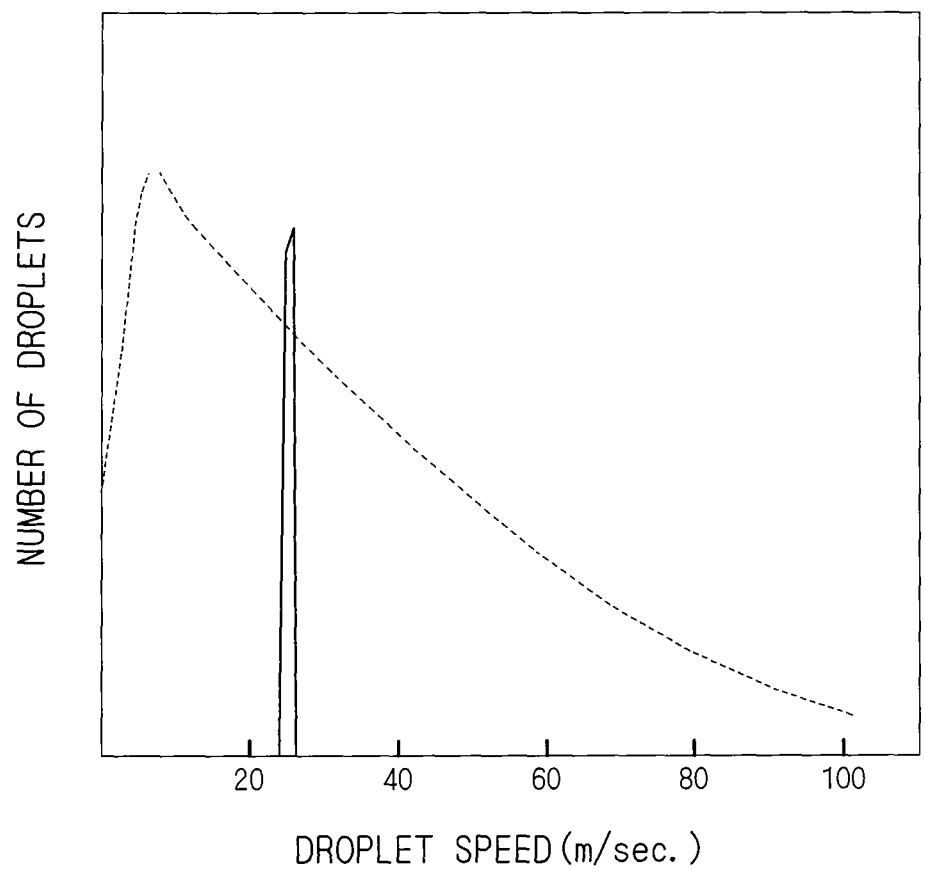

F I G. 6
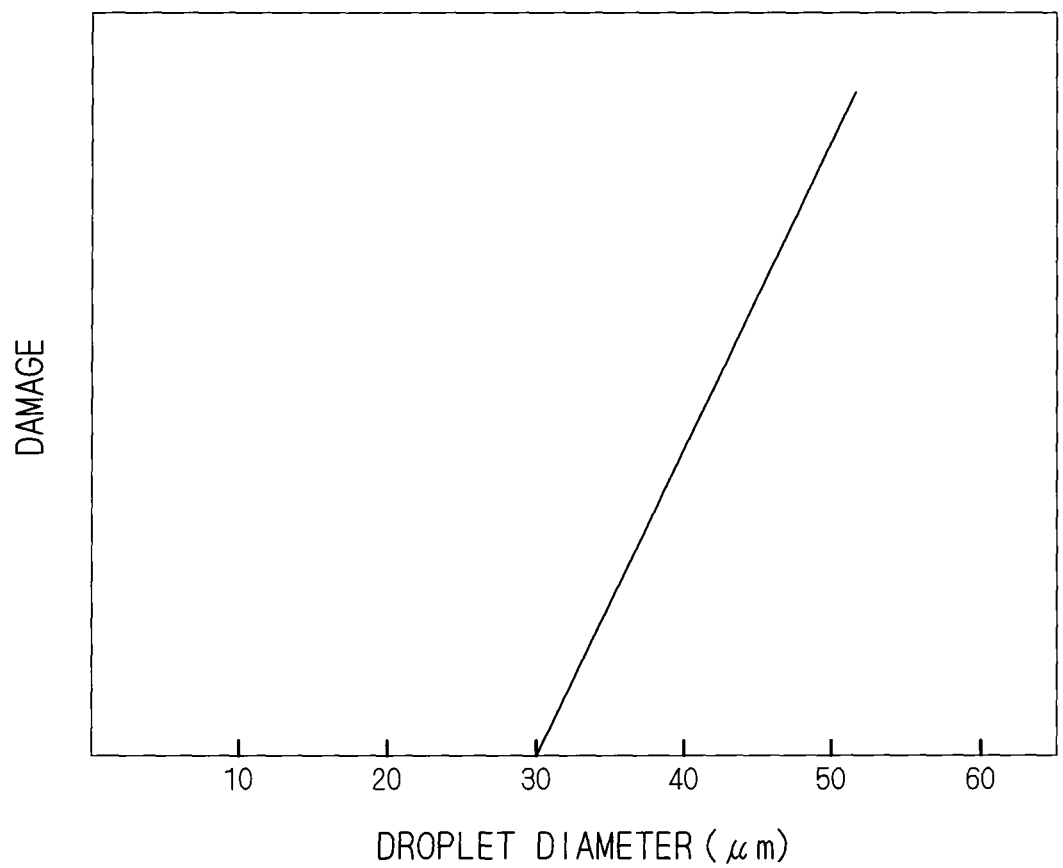

F I G. 9
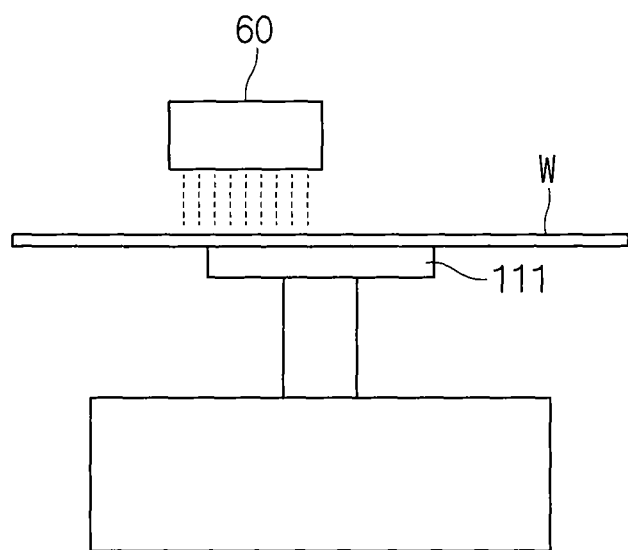

F I G . 1 0
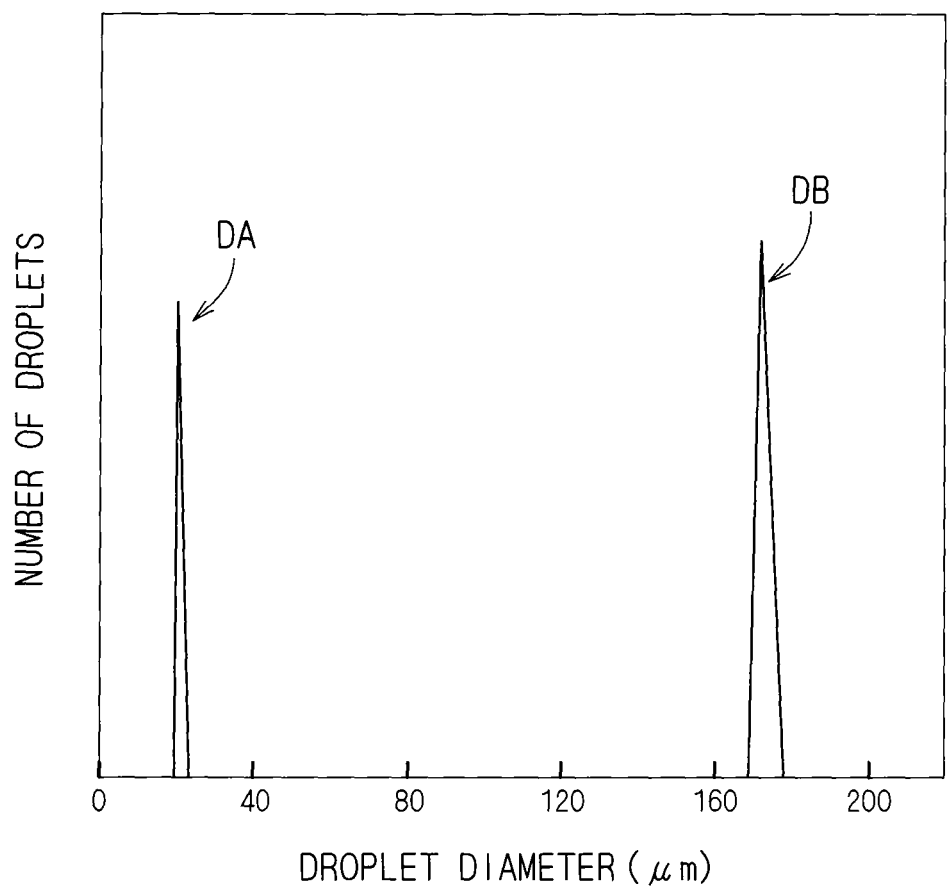

F I G. 1 1
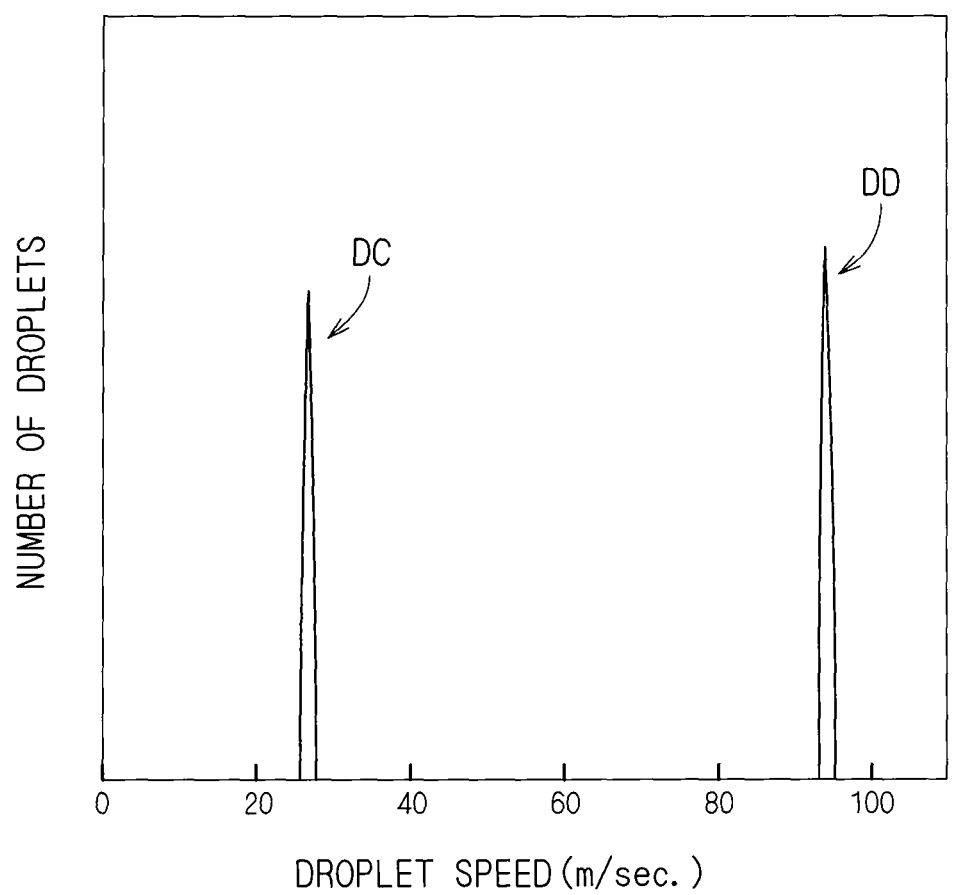

SUBSTRATE CLEANING METHOD AND SUBSTRATE CLEANING APPARATUS

CROSS-REFERENCE TO RELATED APPLICATIONS

The present patent application is a divisional of U.S. patent application Ser. No. 16/881,015, filed May 22, 2020, by Masanobu SATO, entitled "Substrate Cleaning Method and Substrate Cleaning Apparatus," which is a continuation of U.S. patent application Ser. No. 13/965,285, filed Aug. 13, 2013, now U.S. Pat. No. 10,699,894, issued Jun. 30, 2020, which is a divisional of U.S. patent application Ser. No. 12/936,427, filed Oct. 5, 2010, now abandoned, which is a 35 U.S.C. §§ 371 national phase conversion of PCT/JP2009/062968, filed Jul. 17, 2009, which claims priority of Japanese Patent Application No. 2008-221157, filed Aug. 29, 2008. The PCT International Application was published in the Japanese language. The entire contents of each of these patent applications are incorporated herein by reference.

TECHNICAL FIELD

The present invention relates to a substrate cleaning method and a substrate cleaning apparatus for cleaning a semiconductor substrate, a glass substrate for a liquid crystal display device, a glass substrate for a photomask, a substrate for an optical disk, a ceramic plate, and the like (hereinafter referred to simply as "substrates") by discharging droplets of a cleaning liquid onto the substrates.

BACKGROUND ART

In the manufacturing process of a semiconductor substrate and the like, a cleaning step for removing particles deposited on the substrate therefrom has been hitherto essential. A single wafer type cleaning apparatus for executing the cleaning step uses the technique of cleaning a substrate by jetting out fine droplets of a cleaning liquid such as deionized water toward the substrate.

In such a cleaning apparatus, a two-fluid nozzle for producing droplets by mixing a cleaning liquid and a pressurized gas together to jet out a fluid mixture of the droplets and a gas toward the substrate has been widely used, as disclosed, for example, in Japanese Patent Application Laid-Open No. 2007-227878. Foreign materials such as particles deposited on the substrate are physically removed by the kinetic energy of the droplets of the cleaning liquid. Also, Japanese Patent Application Laid-Open No. 2000-533 discloses a cleaning apparatus that causes a piezoelectric element to expand and contract repeatedly at a frequency of an ultrasonic band, thereby emitting a mist of a cleaning liquid accelerated in one direction from a discharge port toward a substrate at a high speed.

As a technique for discharging droplets, on the other hand, Japanese Patent No. 3659593 discloses a droplet spraying apparatus that vibrates a thin film formed with discharge ports of an inverted tapered shape to produce droplets. Also, Japanese Utility Model Publication No. 7-7164 (1995) discloses a nozzle head for an inkjet printer in which a pipe of an annular shape formed with a notch is filled with ink, and in which a vibrator is attached to an outer peripheral wall surface of the pipe except where the notch is formed to vibrate the ink, whereby droplets of ink are emitted.

SUMMARY OF THE INVENTION

Problems to be Solved by the Invention

However, when the two-fluid nozzle as disclosed in Japanese Patent Application Laid-Open No. 2007-227878 is used, the speed and size (droplet diameter) of the produced droplets are distributed over a wide range. In the cleaning process of a semiconductor substrate, it is necessary to ensure the removal of particles without destruction of devices on the substrate. However, when the speed and size of the droplets are distributed over a wide range, some of the droplets are useless droplets not contributing to the removal of the particles, whereas some of the droplets are so harmful droplets as to cause damages to the devices. As a result, there have been problems in that improvements in cleaning efficiency are suppressed and in that there is a likelihood of device destruction. These problems arise similarly in the cleaning of other substrates, and have become a cause of uneven cleaning results.

The present invention has been made to solve the above-mentioned problems. It is therefore an object of the present invention to provide a substrate cleaning method and a substrate cleaning apparatus capable of improving the cleaning efficiency of a substrate.

Means for Solving the Problems

To solve the above-mentioned problems, according to a first aspect of the present invention, in a substrate cleaning method for cleaning a substrate by discharging droplets of a cleaning liquid toward the substrate, droplets of a cleaning liquid having an average droplet diameter in the range from 15 to 200 μm and a droplet diameter distribution where a value of $3\sigma$ (where $\sigma$ is a standard deviation) does not exceed 10% of the average droplet diameter are produced and discharged toward a substrate.

According to a second aspect, in the substrate cleaning method according to the first aspect, droplets having an average droplet speed in the range from 20 to 100 meters per second and a droplet speed distribution where a value of $3\sigma$ (where $\sigma$ is a standard deviation) does not exceed 10% of the average droplet speed are discharged toward the substrate.

According to a third aspect, in the substrate cleaning method according to the first or second aspect, the droplets are discharged toward the substrate at a droplet flow rate of not less than 10 milliliters per minute.

According to a fourth aspect, in a substrate cleaning method for cleaning a semiconductor substrate by discharging droplets of a cleaning liquid toward the semiconductor substrate, droplets of a cleaning liquid having an average droplet diameter in the range from 15 to 30 μm and a droplet diameter distribution where a value of $3\sigma$ (where $\sigma$ is a standard deviation) does not exceed 2 μm are produced and discharged toward a semiconductor substrate.

According to a fifth aspect, in the substrate cleaning method according to the fourth aspect, droplets having an average droplet speed in the range from 20 to 60 meters per second and a droplet speed distribution where a value of $3\sigma$ (where $\sigma$ is a standard deviation) does not exceed 5 meters per second are discharged toward the semiconductor substrate.

According to a sixth aspect, in the substrate cleaning method according to the fourth or fifth aspect, the droplets are discharged toward the semiconductor substrate at a droplet flow rate of not less than 10 milliliters per minute.

According to a seventh aspect, in a substrate cleaning method for cleaning a substrate by discharging droplets of a cleaning liquid toward the substrate, a cleaning liquid is fed to a tubular body including a plurality of discharge holes formed in a wall surface thereof, and vibrations are applied to the cleaning liquid, whereby droplets of the cleaning liquid having an average droplet diameter in the range from 15 to 200 μm and a droplet diameter distribution where a value of $3\sigma$ (where $\sigma$ is a standard deviation) does not exceed 10% of the average droplet diameter are discharged from the plurality of discharge holes toward a substrate.

According to an eighth aspect, in the substrate cleaning method according to the seventh aspect, droplets having an average droplet speed in the range from 20 to 100 meters per second and a droplet speed distribution where a value of $3\sigma$ (where $\sigma$ is a standard deviation) does not exceed 10% of the average droplet speed are discharged from the plurality of discharge holes toward the substrate.

According to a ninth aspect, in the substrate cleaning method according to the seventh or eighth aspect, droplets of the cleaning liquid are discharged from the plurality of discharge holes toward the substrate at a droplet flow rate of not less than 10 milliliters per minute.

According to a tenth aspect, in a substrate cleaning method for cleaning a semiconductor substrate by discharging droplets of a cleaning liquid toward the semiconductor substrate, a cleaning liquid is fed to a tubular body including a plurality of discharge holes formed in a wall surface thereof, and vibrations are applied to the cleaning liquid, whereby droplets of the cleaning liquid having an average droplet diameter in the range from 15 to 30 μm and a droplet diameter distribution where a value of $3\sigma$ (where $\sigma$ is a standard deviation) does not exceed 2 μm are discharged from the plurality of discharge holes toward a semiconductor substrate.

According to an eleventh aspect, in the substrate cleaning method according to the tenth aspect, droplets having an average droplet speed in the range from 20 to 60 meters per second and a droplet speed distribution where a value of $3\sigma$ (where $\sigma$ is a standard deviation) does not exceed 5 meters per second are discharged from the plurality of discharge holes toward the semiconductor substrate.

According to a twelfth aspect, in the substrate cleaning method according to the tenth or eleventh aspect, droplets of the cleaning liquid are discharged from the plurality of discharge holes toward the semiconductor substrate at a droplet flow rate of not less than 10 milliliters per minute.

According to a thirteenth aspect, a substrate cleaning apparatus for cleaning a substrate by discharging droplets of a cleaning liquid toward the substrate comprises a cleaning nozzle having a tubular body including a plurality of discharge holes formed in a wall surface thereof, and a piezoelectric element affixed to the wall surface, the cleaning nozzle being configured to apply vibrations to a cleaning liquid fed to the tubular body from the piezoelectric element, thereby discharging droplets of the cleaning liquid having an average droplet diameter in the range from 15 to 200 μm and a droplet diameter distribution where a value of $3\sigma$ (where $\sigma$ is a standard deviation) does not exceed 10% of the average droplet diameter from the plurality of discharge holes toward a substrate.

According to a fourteenth aspect, in the substrate cleaning apparatus according to the thirteenth aspect, the cleaning nozzle discharges droplets having an average droplet speed in the range from 20 to 100 meters per second and a droplet speed distribution where a value of $3\sigma$ (where $\sigma$ is a standard deviation) does not exceed 10% of the average droplet speed for from the plurality of discharge holes toward the substrate.

According to a fifteenth aspect, in the substrate cleaning apparatus according to the thirteenth or fourteenth aspect, the cleaning nozzle discharges droplets of the cleaning liquid from the plurality of discharge holes toward the substrate at a droplet flow rate of not less than 10 milliliters per minute.

According to a sixteenth aspect, a substrate cleaning apparatus for cleaning a semiconductor substrate by discharging droplets of a cleaning liquid toward the semiconductor substrate comprises a cleaning nozzle having a tubular body including a plurality of discharge holes formed in a wall surface thereof, and a piezoelectric element affixed to the wall surface, the cleaning nozzle being configured to apply vibrations to a cleaning liquid fed to the tubular body from the piezoelectric element, thereby discharging droplets of the cleaning liquid having an average droplet diameter in the range from 15 to 30 μm and a droplet diameter distribution where a value of $3\sigma$ (where $\sigma$ is a standard deviation) does not exceed 2 μm from the plurality of discharge holes toward a semiconductor substrate.

According to a seventeenth aspect, in the substrate cleaning apparatus according to the sixteenth aspect, the cleaning nozzle discharges droplets having an average droplet speed in the range from 20 to 60 meters per second and a droplet speed distribution where a value of $3\sigma$ (where $\sigma$ is a standard deviation) does not exceed 5 meters per second from the plurality of discharge holes toward the semiconductor substrate.

According to an eighteenth aspect, in the substrate cleaning apparatus according to the sixteenth or seventeenth aspect, the cleaning nozzle discharges droplets of the cleaning liquid from the plurality of discharge holes toward the semiconductor substrate at a droplet flow rate of not less than 10 milliliters per minute.

According to a nineteenth aspect, in the substrate cleaning apparatus according to any one of the thirteenth to eighteenth aspects, the tubular body is cylindrical.

According to a twentieth aspect, the substrate cleaning apparatus according to any one of the thirteenth to nineteenth aspects further comprises: a pressure pump for feeding a cleaning liquid through an opening at a first end of the tubular body; and a valve for closing an opening at a second end of the tubular body.

Effect of the Invention

According to the first to third, the seventh to ninth, and the thirteenth to fifteenth aspects of the present invention, the droplets of the cleaning liquid having an average droplet diameter in the range from 15 to 200 μm and a droplet diameter distribution where a value of $3\sigma$ does not exceed 10% of the average droplet diameter are discharged toward the substrate. Thus, there are a small number of useless droplets not contributing to the cleaning. This improves the cleaning efficiency of the substrate.

In particular, according to the second, eighth and fourteenth aspects, the droplets having an average droplet speed in the range from 20 to 100 meters per second and a droplet speed distribution where a value of $3\sigma$ does not exceed 10% of the average droplet speed are discharged toward the substrate. This provides sufficient cleaning efficiency.

In particular, according to the third, ninth and fifteenth aspects, the droplets are discharged toward the substrate at a droplet flow rate of not less than 10 milliliters per minute. This achieves sufficient cleaning in a short time.

According to the fourth to sixth, the tenth to twelfth, and the sixteenth to eighteenth aspects of the present invention, the droplets of the cleaning liquid having an average droplet diameter in the range from 15 to 30 µm and a droplet diameter distribution where a value of 3σ does not exceed 2 µm are discharged toward the semiconductor substrate. Thus, there are a small number of useless droplets not contributing to the cleaning and a small number of droplets that cause damages to the semiconductor substrate. This improves the cleaning efficiency of the substrate.

In particular, according to the fifth, eleventh and seventeenth aspects, the droplets having an average droplet speed in the range from 20 to 60 meters per second and a droplet speed distribution where a value of 3σ does not exceed 5 meters per second are discharged toward the semiconductor substrate. This provides sufficient cleaning efficiency.

In particular, according to the sixth, twelfth and eighteenth aspects, the droplets are discharged toward the semiconductor substrate at a droplet flow rate of not less than 10 milliliters per minute. This achieves sufficient cleaning in a short time.

BRIEF DESCRIPTION OF DRAWINGS

FIG. 5 is a graph showing distributions of the droplet speed of the cleaning liquid;

FIG. 6 is a graph showing a correlation between the droplet diameter of discharged droplets and damages to the substrate;

FIG. 9 is a view showing a substrate cleaning apparatus for performing a cleaning process on a substrate including other types;

FIG. 10 is a graph showing distributions of the droplet diameter of the cleaning liquid appropriate for the cleaning of the substrate including other types;

FIG. 11 is a graph showing distributions of the droplet speed of the cleaning liquid appropriate for the cleaning of the substrate including other types;

EMBODIMENTS OF THE INVENTION

Embodiments according to the present invention will now be described in detail with reference to the drawings.

Figure 1:
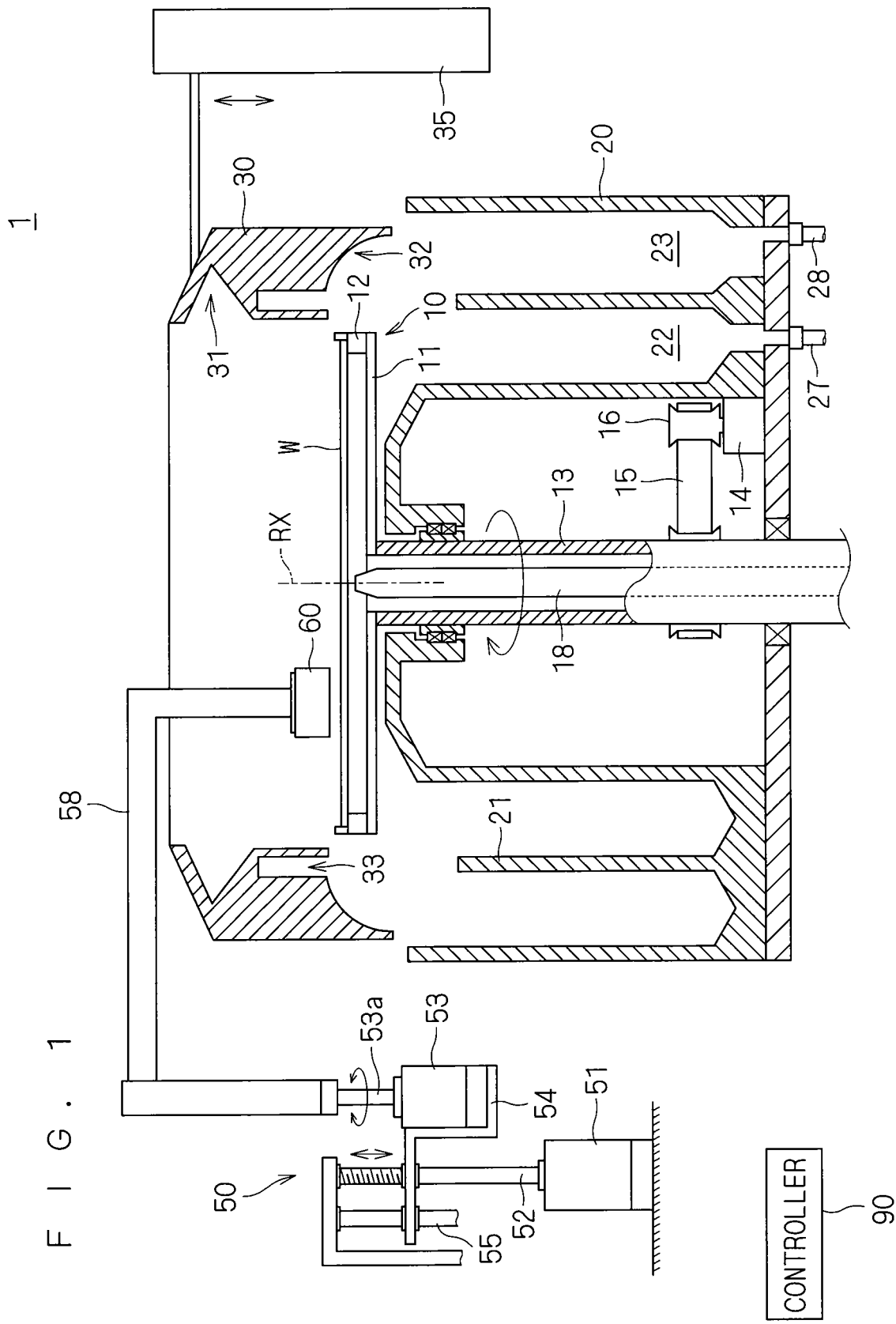
FIG. 1 is a view showing an example of a substrate cleaning apparatus appropriate for the cleaning of a semiconductor substrate.

FIG. 1 is a view showing an example of a substrate cleaning apparatus appropriate for the cleaning of a semiconductor substrate. This substrate cleaning apparatus 1 is a single wafer type cleaning apparatus for cleaning semiconductor substrates W one by one, and cleans a circular substrate W of silicon by removing contaminants such as particles deposited on the substrate W therefrom. The substrate cleaning apparatus 1 includes a rotary holding part 10, a processing cup 20, a splash guard 30, a nozzle driving part 50, a cleaning nozzle 60, and a controller 90 as its principal components.

The rotary holding part 10 includes a spin base 11, a rotary shaft 13, and a motor 14. The spin base 11 is a disk-shaped member having a diameter slightly greater than that of the substrate W. The spin base 11 has a plurality of (in this embodiment, six) support pins 12 provided upright on a peripheral portion of the upper surface of the spin base 11 and arranged on the circumference of the same circle. Each of the support pins 12 includes a cylindrical support portion for supporting a peripheral portion of the lower surface of the substrate W from below, and a pin portion protruding from the upper surface of the support portion and abutting against an edge portion of the substrate W to push the substrate W. Three out of the six support pins 12 are fixed support pins fixedly provided on the spin base 11. Each of the fixed support pins is configured such that the protruding pin portion is provided over the axis of the cylindrical support portion. On the other hand, the remaining three out of the six support pins 12 are movable support pins provided rotatably (on their axes) relative to the spin base 11. Each of the movable support pins is configured such that the protruding pin portion is provided slightly eccentrically with respect to the axis of the cylindrical support portion. The three movable support pins are pivotably driven in cooperation with each other by a linkage mechanism and a drive mechanism both not shown. The pivotal movement of the movable support pins allows the six pin portions to grasp the edge portion of the substrate W and to release the grasp of the substrate W. The six support pins 12 grasp the edge portion of the substrate W to thereby allow the spin base 11 to hold the substrate W in a horizontal position without contacting a central portion of the lower surface of the substrate W.

The rotary shaft 13 is suspended from a central portion of the lower surface of the spin base 11. The rotary shaft 13 is cooperatively coupled to a driving pulley 16 of the motor 14 through a driving belt 15. As the motor 14 rotatably drives the driving pulley 16, the driving belt 15 runs around to rotate the rotary shaft 13. This causes the substrate W held by the spin base 11 to rotate around a vertical central axis RX within a horizontal plane together with the spin base 11 and the rotary shaft 13.

The rotary shaft 13 also has a hollow interior in which a processing liquid nozzle 18 is inserted in a vertical direction. The processing liquid nozzle 18 is connected in communication with a processing liquid supply source not shown. The processing liquid nozzle 18 has a tip opening toward the central portion of the lower surface of the substrate W held by the spin base 11. This allows the supply of a processing liquid from the tip of the processing liquid nozzle 18 to the central portion of the lower surface of the substrate W.

A gap between the inner wall surface of the rotary shaft 13 and the outer wall surface of the processing liquid nozzle 18 serves as a gas supply passage which in turn is connected in communication with a gas supply source not shown. This allows the supply of a gas from the upper end of the gap toward the lower surface of the substrate W held by the spin base 11.

The processing cup 20 is provided to surround the rotary holding part 10. A cylindrical partition wall 21 is provided within the processing cup 20. A drainage space 22 for draining a cleaning liquid used for the cleaning process of the substrate W is formed within the partition wall 21 so as to surround the rotary holding part 10. A collection space 23 for collecting the cleaning liquid used for the cleaning process of the substrate W is defined between the outer wall of the processing cup 20 and the partition wall 21 so as to surround the drainage space 22.

A drainage pipe 27 for guiding the cleaning liquid to a drainage processing apparatus (not shown) is connected to the drainage space 22, and a collection pipe 28 for guiding the cleaning liquid to a collection processing apparatus (not shown) is connected to the collection space 23.

The splash guard 30 for preventing the cleaning liquid from the substrate W from splashing outwardly is provided over the processing cup 20. This splash guard 30 has a configuration rotationally symmetric with respect to the central axis RX. A drainage guide groove 31 of a V-shaped sectional configuration is formed annularly in the inner surface of an upper end portion of the splash guard 30. A collected liquid guide portion 32 defined by an outwardly downwardly inclined surface is formed in the inner surface of a lower end portion of the splash guard 30. A partition wall receiving groove 33 for receiving the partition wall 21 in the processing cup 20 is formed near the upper end of the collected liquid guide portion 32.

The splash guard 30 is driven to move upwardly and downwardly in a vertical direction by a guard up-and-down driving mechanism 35 including a ball screw mechanism and the like. The guard up-and-down driving mechanism 35 moves the splash guard 30 upwardly and downwardly between a collection position in which the collected liquid guide portion 32 surrounds the edge portion of the substrate W held by the spin base 11 and a drainage position in which the drainage guide groove 31 surrounds the edge portion of the substrate W held by the spin base 11. When the splash guard 30 is in the collection position (the position shown in FIG. 1), the cleaning liquid splashed from the edge portion of the substrate W is guided by the collected liquid guide portion 32 into the collection space 23, and is then collected through the collection pipe 28. When the splash guard 30 is in the drainage position, on the other hand, the cleaning liquid splashed from the edge portion of the substrate W is guided by the drainage guide groove 31 into the drainage space 22, and is then drained through the drainage pipe 27. In this manner, the drainage and collection of the cleaning liquid are selectively executable. When the substrate W is transferred to and received from the spin base 11, the guard up-and-down driving mechanism 35 moves the splash guard 30 downwardly to a vertical position in which the spin base 11 protrudes upwardly from the upper end of the splash guard 30.

The nozzle driving part 50 includes a vertical movement motor 51, a swing motor 53, and a nozzle arm 58. The nozzle arm 58 has a distal end to which the cleaning nozzle 60 attached. The nozzle arm 58 has a proximal end coupled to a motor shaft 53a of the swing motor 53. The swing motor 53 causes the cleaning nozzle 60 to pivot about the motor shaft 53a within a horizontal plane.

The swing motor 53 is mounted to a vertical movement base 54. The vertical movement base 54 is in threaded engagement with a ball screw 52 coupled directly to the motor shaft of the fixedly provided vertical movement motor 51, and is slidably mounted to a guide member 55. As the vertical movement motor 51 rotates the ball screw 52, the cleaning nozzle 60 moves upwardly and downwardly together with the vertical movement base 54.

The vertical movement motor 51 and the swing motor 53 in the nozzle driving part 50 move the cleaning nozzle 60 between a retracted position that is outside the splash guard 30 and a cleaning position that is over the spin base 11. Also, the swing motor 53 causes the cleaning nozzle 60 to pivot over the spin base 11 between a position over the central portion of the substrate W and a position over the edge portion thereof.

The controller 90 controls various operating mechanisms provided in the substrate cleaning apparatus 1. The controller 90 is similar in hardware construction to a typical computer. Specifically, the controller 90 includes a CPU for performing various computation processes, a ROM or read-only memory for storing a basic program therein, a RAM or readable/writable memory for storing various pieces of information therein, and a magnetic disk for storing control software and data therein.

Figure 2:
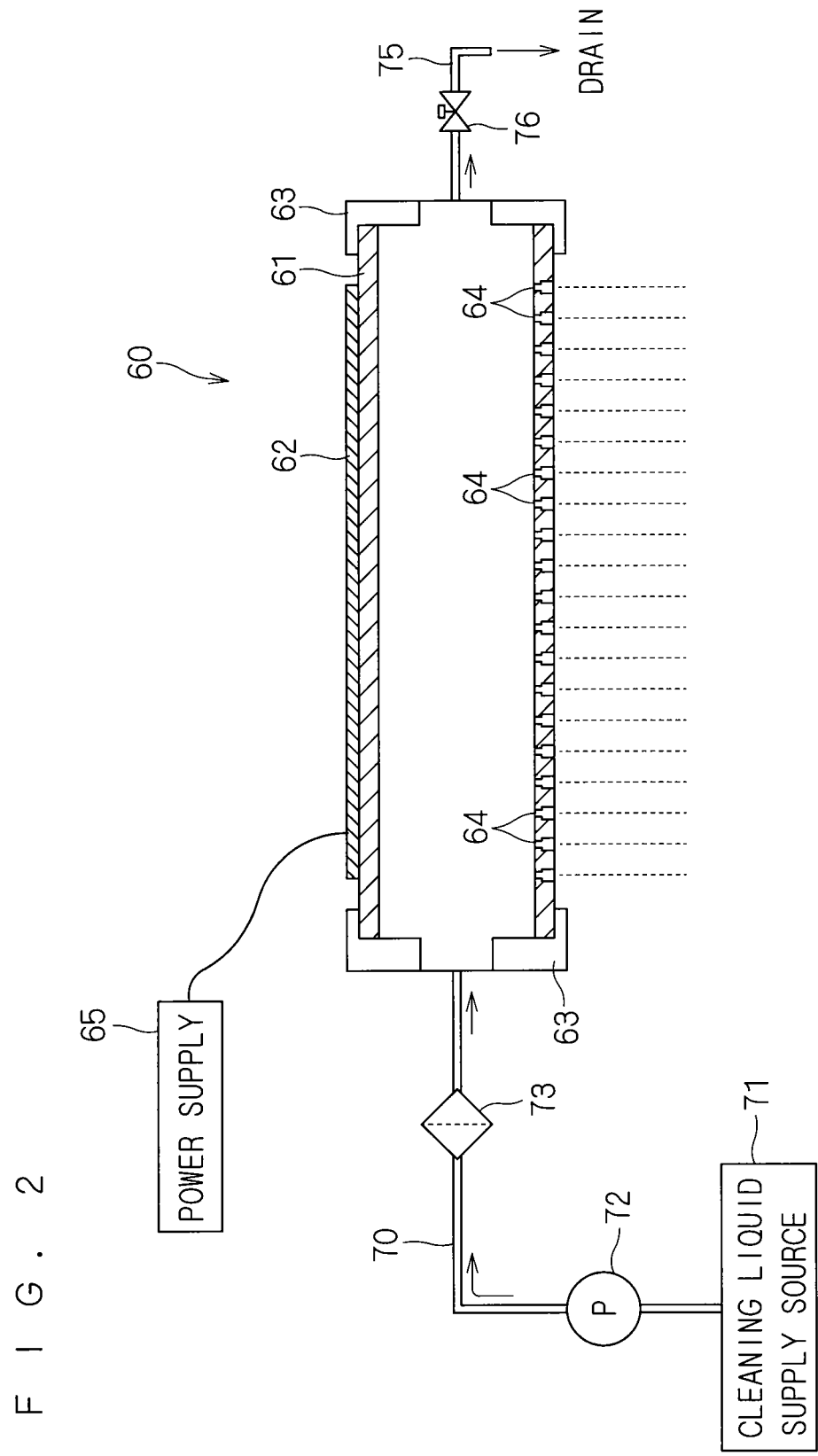
FIG. 2 is a view schematically showing the construction of a cleaning nozzle.
Figure 3:
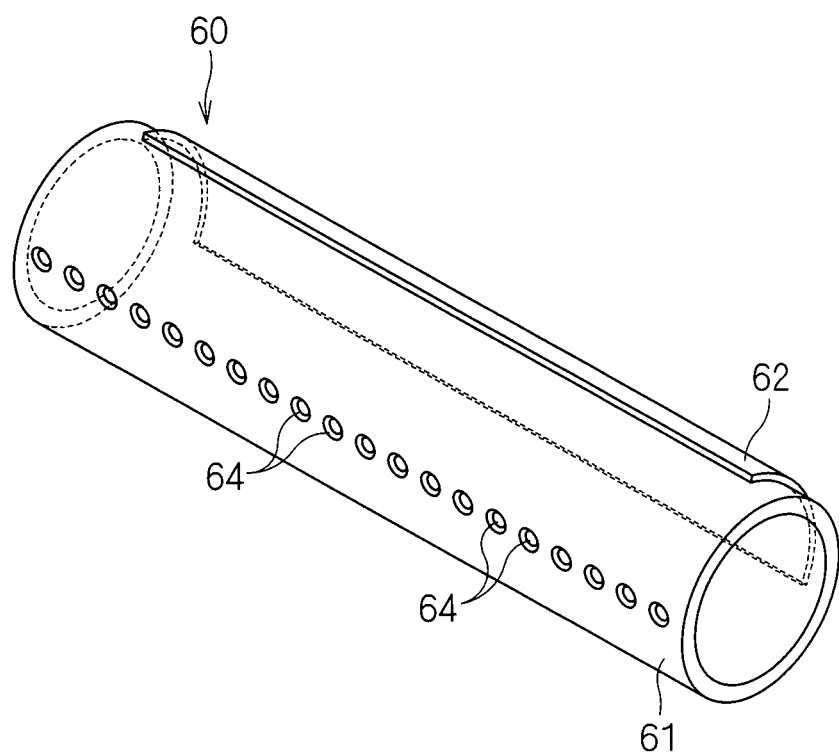
FIG. 3 is a perspective view of the cleaning nozzle.

FIG. 2 is a view schematically showing the construction of the cleaning nozzle 60. FIG. 3 is a perspective view of the cleaning nozzle 60. The cleaning nozzle 60 serving as a cleaning head is configured such that a piezoelectric element (piezo element) 62 is affixed to a cylindrical tubular body 61. The cleaning nozzle 60 is attached to the distal end of the nozzle arm 58 with a holder 63 made of resin therebetween. The holder 63 is not shown in FIG. 3.

The cylindrical tubular body 61 includes a hollow interior space formed therein, and has opposite ends both open. In this embodiment, the tubular body 61 is made of quartz, and has a length of 50 mm. The tubular body 61 may be made of ceramics such as zirconia ($ZrO_2$).

The tubular body 61 has a plurality of (in this embodiment, 20) discharge holes 64 formed in the wall surface thereof. The 20 discharge holes 64 are arranged in a line in a longitudinal direction of the tubular body 61. Each of the discharge holes 64 has a substantially cylindrical shape extending through the side wall of the tubular body 61. The 20 discharge holes 64 have a uniform diameter in the range from 7 to 12 μm. The spacing between the 20 discharge holes 64 (the distance between adjacent ones of the discharge holes 64) is 1 mm.

The piezoelectric element 62 is affixed to a portion of the outer wall surface of the tubular body 61 opposed to the plurality of discharge holes 64. The piezoelectric element 62 is electrically connected to a power supply 65 having a high-frequency generator. The power supply 65 applies an alternating voltage having a predetermined frequency to the piezoelectric element 62.

An opening at a first end of the interior space of the tubular body 61 is connected in communication with a cleaning liquid supply source 71 through a supply pipe 70. A pressure pump 72 and a filter 73 are inserted in the path of the supply pipe 70. The pressure pump 72 feeds the cleaning liquid (in this embodiment, deionized water) under pressure from the cleaning liquid supply source 71 toward the cleaning nozzle 60. The filter 73 removes contaminants contained in the cleaning liquid fed from the cleaning liquid supply source 71.

An opening at a second end of the interior space of the tubular body 61, on the other hand, is connected in communication with a delivery pipe 75. A valve 76 is inserted in the path of the delivery pipe 75. When the valve 76 is opened while the cleaning liquid is supplied from the supply pipe 70 to the interior space of the tubular body 61, the cleaning liquid is drained through the delivery pipe 75 to the outside of the apparatus.

Next, the processing operations of the substrate cleaning apparatus 1 having the above-mentioned construction will be described. The controller 90 executes software for a predetermined cleaning process to control the mechanisms of the substrate cleaning apparatus 1, whereby the processing operations to be described below are performed.

First, a substrate W is transferred to the spin base 11, with the splash guard 30 placed in a lowered position so that the spin base 11 protrudes upwardly from the splash guard 30. Subsequently, the splash guard 30 moves upwardly to the above-mentioned drainage position, and the nozzle driving part 50 moves the cleaning nozzle 60 to the cleaning position that is over the substrate W held by the spin base 11. In the cleaning position, the spacing between the plurality of discharge holes 64 of the cleaning nozzle 60 and the substrate W shall be in the range from 5 to 25 mm.

The cleaning liquid always continues to be fed from the pressure pump 72 to the cleaning nozzle 60 even when the cleaning process is not performed. When the cleaning process is not performed, the valve 76 is open so that the cleaning liquid fed to the interior of the tubular body 61 continues to be directly drained through the delivery pipe 75 to the outside of the apparatus. In other words, the cleaning liquid continues to be fed to the cleaning nozzle 60 and continues to be drained to the outside of the apparatus even when the cleaning nozzle 60 is on standby in the retracted position that is outside the splash guard 30 and when the cleaning nozzle 60 is moving from the retracted position to the cleaning position that is over the substrate W.

Next, the rotary holding part 10 starts rotating the substrate W, and droplets of the cleaning liquid are discharged from the cleaning nozzle 60 toward the upper surface of the substrate W. At this time, the cleaning liquid may be discharged from the processing liquid nozzle 18 toward the lower surface of the substrate W. Also, the nozzle driving part 50 causes the cleaning nozzle 60 to pivot between the position over the central portion of the substrate W and the position over the edge portion thereof, whereby the cleaning process proceeds. When the cleaning process is performed, the valve 76 is closed while the cleaning liquid is fed to the cleaning nozzle 60. Thus, the liquid pressure of the cleaning liquid within the tubular body 61 increases, whereby the cleaning liquid is discharged from the 20 discharge holes 64. In this embodiment, the liquid pressure of the cleaning liquid within the tubular body 61 shall be not greater than 10 MPa.

When the cleaning process is performed, the power supply 65 applies the alternating voltage having the predetermined frequency to the piezoelectric element 62. This causes the piezoelectric element 62 to expand and contract repeatedly, thereby applying vibrations at the predetermined frequency to the cleaning liquid within the tubular body 61. When the liquid pressure of the cleaning liquid within the tubular body 61 is increased while vibrations are applied to the cleaning liquid, the cleaning liquid flowing out of the 20 discharge holes 64 under the liquid pressure is dispersed and divided into droplets by the vibrations, so that the droplets of the cleaning liquid are discharged from the 20 discharge holes 64. The division of the liquid flow out of the discharge holes 64 into droplets is achieved by the following process. The cleaning liquid maintained at a constant pressure or at pressures (D.C. pressures) within a narrow range is supplied into the tubular body 61. The cleaning liquid flows out of the discharge holes 64 at a discharge rate substantially equal at the 20 discharge holes 64 because of the pressure. When the alternating voltage having the fixed predetermined frequency is applied to the piezoelectric element 62 in this state, the generated vibrations cause the liquid flow to disperse and divide into droplets. The supply pressure of the cleaning liquid produced by the pressure pump 72 and the frequency of the alternating current applied to the piezoelectric element 62 take values falling outside the range of the normal operation of a continuous inkjet apparatus as described in the prior art. Contaminants such as particles deposited on the substrate W are physically removed by the kinetic energy of the droplets discharged from the cleaning nozzle 60.

The controller 90 controls the pressure pump 72 to adjust the liquid pressure of the cleaning liquid within the tubular body 61 and also controls the power supply 65 to adjust the vibrations applied to the cleaning liquid, thereby specifying the discharge conditions (parameters) of the droplets discharged from the 20 discharge holes 64. In addition, the diameter of the discharge holes 64 and the number of discharge holes 64 have an influence on the discharge conditions of the droplets.

In the present embodiment, the average droplet diameter of the droplets of the cleaning liquid discharged from the 20 discharge holes 64 toward the substrate W shall be in the range from 15 to 30 µm. It is important herein that the droplet diameter of the droplets discharged from the cleaning nozzle 60 is not widely distributed over the range from 15 to 30 µm but variations in the droplet diameter are quite small. Specifically, the distribution of the droplet diameter is such that the value of 3σ (where σ is a standard deviation) does not exceed 2 µm.

Figure 4:
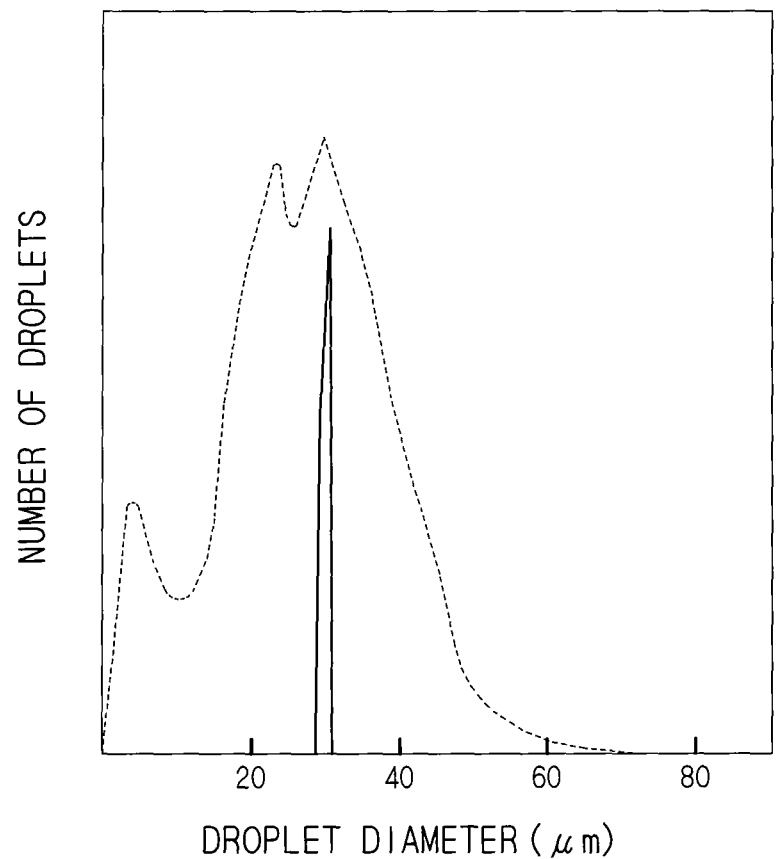
FIG. 4 is a graph showing distributions of the droplet diameter of a cleaning liquid.

FIG. 4 is a graph showing distributions of the droplet diameter of the cleaning liquid. In FIG. 4, the droplet diameter distribution of the droplets discharged from the cleaning nozzle 60 according to the present embodiment is depicted by the solid line, and the droplet diameter distribution of droplets discharged from the conventional two-fluid nozzle is depicted by the dotted line. The droplet diameter of the droplets discharged from the conventional two-fluid nozzle has a wide distribution which in turn includes not only droplets having a droplet diameter in the range from 15 to 30 µm but also a large number of droplets having a droplet diameter falling outside the range. In contrast to this, the droplet diameter of the droplets discharged from the cleaning nozzle 60 according to the present embodiment has a very narrow distribution, and there is little variation in the droplet diameter.

In the present embodiment, the average droplet speed of the droplets of the cleaning liquid discharged from the 20 discharge holes 64 toward the substrate W shall be in the range from 20 to 60 meters per second. Like the droplet diameter, the droplet speed of the droplets discharged from the cleaning nozzle 60 is not widely distributed over the range from 20 to 60 meters per second but variations in the droplet speed are quite small. Specifically, the distribution of the droplet speed is such that the value of 3σ does not exceed 5 meters per second.

FIG. 5 is a graph showing distributions of the droplet speed of the cleaning liquid. In FIG. 5, the droplet speed distribution of the droplets discharged from the cleaning nozzle 60 according to the present embodiment is also depicted by the solid line, and the droplet speed distribution of the droplets discharged from the conventional two-fluid nozzle is depicted by the dotted line. The droplet speed of the droplets discharged from the conventional two-fluid nozzle has a very wide distribution. In contrast to this, the droplet speed of the droplets discharged from the cleaning nozzle 60 according to the present embodiment has a very narrow distribution.

In this manner, variations in the droplet diameter and droplet speed of the droplets discharged from the cleaning nozzle 60 according to the present embodiment are allowed to fall within a small range. This is because the cleaning liquid is discharged from the plurality of discharge holes 64 by applying vibrations from the piezoelectric element 62 to the cleaning liquid filled in the interior of the tubular body 61 under a high pressure. In other words, the conventional two-fluid nozzle produces droplets by causing a pressurized gas to collide with a liquid. Thus, the droplets are discharged in the form of a multiphase flow of the droplets and the gas, and are hence difficult to control. This results in wide distributions of and great variations in the droplet diameter and droplet speed of the droplets. The cleaning nozzle 60 according to the present embodiment, on the other hand, discharges the pressurized liquid from the plurality of discharge holes 64 while applying vibrations to the pressurized liquid. Thus, only the droplets are discharged. This allows narrow distributions of and small variations in the droplet diameter and droplet speed of the droplets.

FIG. 6 is a graph showing a correlation between the droplet diameter of the discharged droplets and damages to the substrate W. As shown in FIG. 6, damages to the substrate W occur when the droplet diameter exceeds 30 μm. The greater the droplet diameter is, the greater the damages are. Since the average droplet diameter of the droplets of the cleaning liquid discharged from the cleaning nozzle 60 is in the range from 15 to 30 μm, damages to the substrate W is prevented during the cleaning process. Also, variations in droplet diameter are quite small and the value of 3σ does not exceed 2 μm. For this reason, there are no useless droplets not contributing to the cleaning, and there are no harmful droplets that cause damages to the substrate W. Thus, cleaning efficiency is improved without damages to the substrate W.

Figure 7:
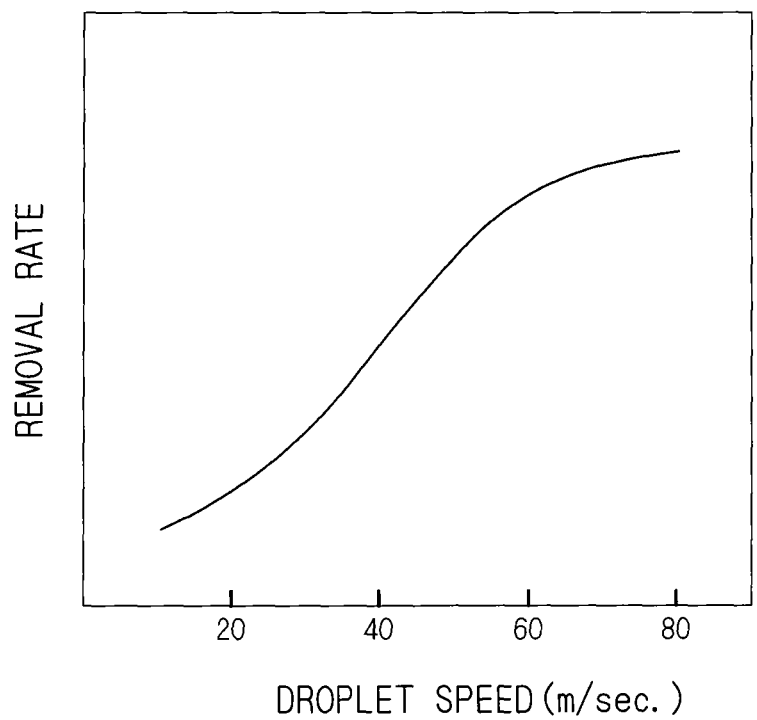
FIG. 7 is a graph showing a correlation between the droplet speed of the discharged droplets and the removal rate of contaminants.

FIG. 7 is a graph showing a correlation between the droplet speed of the discharged droplets and the removal rate of contaminants. As shown in FIG. 7, the higher the droplet speed of the discharged droplets is, the higher the removal rate of contaminants is. Since the average droplet speed of the droplets of the cleaning liquid discharged from the cleaning nozzle 60 according to the present embodiment is in the range from 20 to 60 meters per second, necessary removal performance is attained. Additionally, variations in droplet speed are quite small and the value of 3σ does not exceed 5 meters per second. For this reason, there are few useless droplets not contributing to the cleaning.

Figure 8:
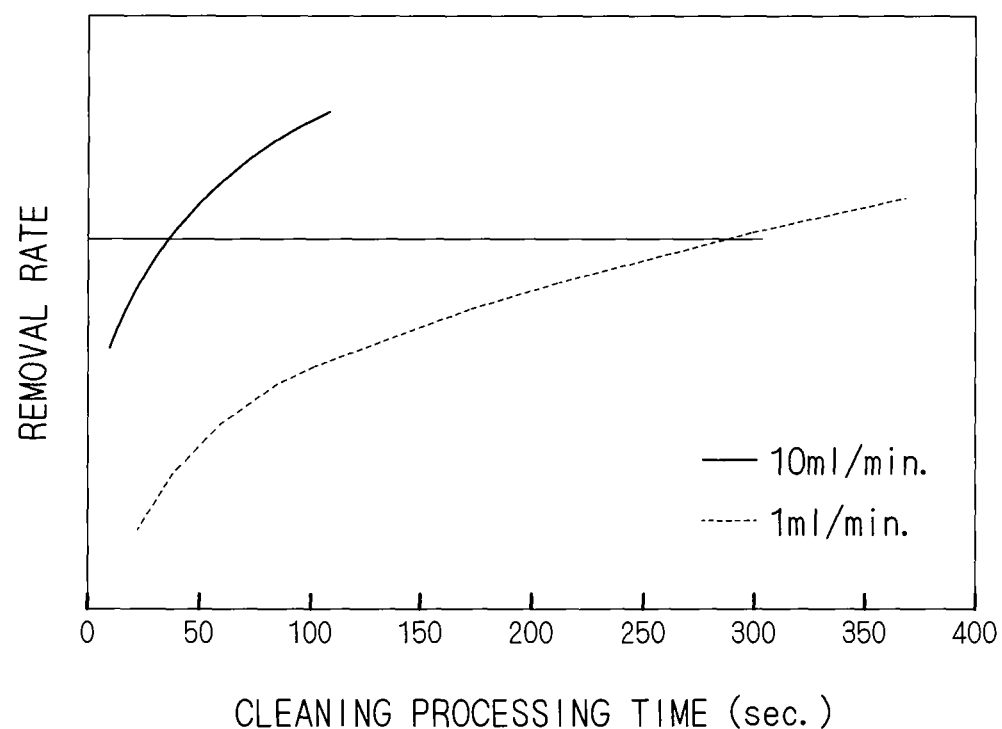
FIG. 8 is a graph showing a difference in the removal rate of contaminants depending on the droplet flow rate of the discharged droplets.

Also, the cleaning nozzle 60 is provided with the 20 discharge holes 64. In the present embodiment, the total flow rate of the droplets of the cleaning liquid discharged from the 20 discharge holes 64 toward the substrate W shall be not less than 10 milliliters per minute. FIG. 8 is a graph showing a difference in the removal rate of contaminants depending on the droplet flow rate of the discharged droplets. In FIG. 8, the dotted line represents the removal rate of contaminants when the droplets of the cleaning liquid are discharged at a droplet flow rate of 1 milliliter per minute, and the solid line represents the removal rate of contaminants when the droplets of the cleaning liquid are discharged at a droplet flow rate of 10 milliliters per minute. The higher the droplet flow rate is, the higher the cleaning efficiency is. When the droplets of the cleaning liquid are discharged at a droplet flow rate of 1 milliliter per minute, it requires 300 seconds to attain a sufficient removal rate. However, when the droplets are discharged at a droplet flow rate of 10 milliliters per minute, the same removal rate is attainable in 30 seconds. For the single wafer type substrate cleaning apparatus 1, it is generally reasonable that the time required for the cleaning process of a single substrate W is 30 seconds.

As described above, the droplets of the cleaning liquid are discharged from the cleaning nozzle 60 toward the substrate W during the cleaning process. The average droplet diameter of the droplets discharged from the cleaning nozzle 60 is in the range from 15 to 30 μm, and the distribution thereof is such that the value of 3σ does not exceed 2 μm. Also, the average droplet speed of the discharged droplets is in the range from 20 to 60 meters per second, and the distribution thereof is such that the value of 3σ does not exceed 5 meters per second. Additionally, the droplet flow rate of the discharged droplets is not less than 10 milliliters per minute. Discharging the droplets of the cleaning liquid from the cleaning nozzle 60 toward the substrate W while satisfying these discharge conditions improves the cleaning efficiency without damages to the substrate W to attain the sufficient removal rate of contaminants in a short time.

During the cleaning process, the cleaning nozzle 60 is pivoted repeatedly between the position over the central portion of the substrate W and the position over the edge portion thereof. The cleaning process is performed uniformly over the entire surface of the substrate W. The liquid splashed from the rotating substrate W by centrifugal force is guided by the drainage guide groove 31 into the drainage space 22, and is drained through the drainage pipe 27.

After a lapse of a predetermined period of cleaning processing time, the valve 76 is opened to stop the discharge of the droplets from the cleaning nozzle 60, and the nozzle driving part 50 moves the cleaning nozzle 60 to the retracted position. Subsequently, the number of rotation of the substrate W is increased so that the drying process of the substrate W is performed. After the completion of the drying process, the rotation of the substrate W is stopped, and the splash guard 30 moves downwardly. Then, the processed substrate W is transported outwardly from the spin base 11. Thus, a series of processing operations in the substrate cleaning apparatus 1 is completed. Preferably, the position of the splash guard 30 during the cleaning and drying processes is changed as appropriate depending on the need for the collection or drainage of the cleaning liquid.

Although the embodiment according to the present invention has been described hereinabove, various modifications in addition to the above may be made therein without departing from the spirit and scope of the present invention. As an example, the liquid pressure of the cleaning liquid within the tubular body 61 is not greater than 10 MPa in the substrate cleaning apparatus 1 according to the above-mentioned embodiment. However, the liquid pressure is not limited to this. For example, a higher liquid pressure is required when the diameter of the discharge holes 64 is smaller than that of the above-mentioned embodiment.

Also, in the substrate cleaning apparatus 1 according to the above-mentioned embodiment, the cleaning liquid is supplied to the cleaning nozzle 60 even when the cleaning process is not performed, and is drained to the outside of the apparatus. However, this may be configured in the form of a circulation system. Specifically, a pipe downstream from the valve 76 is connected through a filter to the cleaning liquid supply source 71 so that the cleaning liquid from the cleaning nozzle 60 flows back to the cleaning liquid supply source 71.

The substrate cleaning apparatus 1 according to the above-mentioned embodiment is suitable for the cleaning of a semiconductor substrate as the substrate W, but the cleaning technique according to the present invention may be applied to the cleaning of other types of substrates W.

Examples of other types of substrates W include a glass substrate for a liquid crystal display device, and a ceramic plate such as a dish.

FIG. 9 is a view showing a substrate cleaning apparatus for performing a cleaning process on a substrate W including other types. The substrate W is held by a support base 111. The cleaning nozzle 60 serving as a cleaning head is moved relative to the substrate W held by the support base 111. The cleaning nozzle 60 may be moved over the substrate W by a sliding movement mechanism not shown or the support base 111 may be driven, with the cleaning nozzle 60 held fixed. Also, the cleaning nozzle 60 may be moved manually.

The construction of the cleaning nozzle 60 is similar to that described in the above-mentioned embodiment with reference to FIGS. 2 and 3. Specifically, while feeding a cleaning liquid to the cleaning nozzle 60, the valve 76 is closed to increase the liquid pressure of the cleaning liquid within the tubular body 61. At the same time, the piezoelectric element 62 applies vibrations to the cleaning liquid within the tubular body 61. This causes droplets of the cleaning liquid to be produced and discharged from the 20 discharge holes 64. Contaminants deposited on the substrate W are physically removed by the droplets discharged from the cleaning nozzle 60.

For the cleaning of the substrate W including other types, the controller 90 controls the pressure pump 72 to adjust the liquid pressure of the cleaning liquid within the tubular body 61, and controls the power supply 65 to adjust the vibrations applied to the cleaning liquid, thereby specifying the discharge conditions of the droplets discharged from the 20 discharge holes 64. When it comes to the droplet diameter, the average droplet diameter of the droplets of the cleaning liquid discharged from the 20 discharge holes 64 toward the substrate W shall be in the range from 15 to 200 µm. As in the above-mentioned embodiment, the droplet diameter of the droplets discharged from the cleaning nozzle 60 is not widely distributed over the range from 15 to 200 µm but variations in the droplet diameter are quite small. Specifically, the distribution of the droplet diameter is such that the value of $3\sigma$ (where $\sigma$ is a standard deviation) does not exceed 10% of the average droplet diameter.

FIG. 10 is a graph showing distributions of the droplet diameter of the cleaning liquid. Droplets having a distribution DA are relatively small in average droplet diameter and are suitable for the cleaning of semiconductor substrates. On the other hand, droplets having a distribution DB are relatively large in average droplet diameter and are suitable for the cleaning of ceramic plates. The distributions of the droplet diameter of the droplets discharged from the cleaning nozzle 60 are so narrow that the value of $3\sigma$ does not exceed 10% of the average droplet diameter, independently of the average droplet diameter, and there is little variation in the droplet diameter. For this reason, there are no useless droplets not contributing to the cleaning, and there are no harmful droplets that cause damages to the substrate W. Thus, the cleaning efficiency is improved without damages to the substrate W. However, as the average droplet diameter increases, the variations increase gradually. When the average droplet diameter exceeds 200 µm, it is difficult that the value of $3\sigma$ is equal to or less than 10% of the average droplet diameter in the distribution of the droplet diameter. In the light of the manufacture of the cleaning nozzle 60, the average droplet diameter exceeding 200 µm is not practical because the variations cannot be suppressed.

When it comes to the droplet speed, the average droplet speed of the droplets of the cleaning liquid discharged from the 20 discharge holes 64 toward the substrate W shall be in the range from 20 to 100 meters per second. Like the droplet diameter, the droplet speed of the droplets discharged from the cleaning nozzle 60 is not widely distributed over the range from 20 to 100 meters per second but variations in the droplet speed are quite small. Specifically, the distribution of the droplet speed is such that the value of $3\sigma$ (where $\sigma$ is a standard deviation) does not exceed 10% of the average droplet speed. The liquid pressure of the cleaning liquid supplied to the cleaning nozzle 60 is not limited to 10 MPa or lower, but the supply of the cleaning liquid at a higher liquid pressure is required depending on conditions such as the diameter of the discharge holes 64.

FIG. 11 is a graph showing distributions of the droplet speed of the cleaning liquid. Depending on the type of substrate W to be cleaned, droplets relatively low in average droplet speed as represented by a distribution DC may be used or droplets relatively high in average droplet speed as represented by a distribution DD may be used. The distributions of the droplet speed of the droplets discharged from the cleaning nozzle 60 are so narrow that the value of $3\sigma$ does not exceed 10% of the average droplet speed, independently of the average droplet speed, and there is little variation in the droplet diameter. For this reason, there are few useless droplets not contributing to the cleaning. However, as the average droplet speed increases, the variations increase gradually. When the average droplet speed exceeds 100 meters per second, it is difficult that the value of $3\sigma$ is equal to or less than 10% of the average droplet speed in the distribution of the droplet speed.

When it comes to the droplet flow rate, the total flow rate of the droplets of the cleaning liquid discharged from the 20 discharge holes 64 toward the substrate W shall be not less than 10 milliliters per minute. Discharging the droplets of the cleaning liquid from the cleaning nozzle 60 toward the substrate W while satisfying these discharge conditions depending on the type of substrate W eliminates useless droplets not contributing to the cleaning and harmful droplets that cause damages to the substrate W to improve the cleaning efficiency without damages to the substrate W, thereby attaining the sufficient removal rate of contaminants in a short time.

Figure 12:
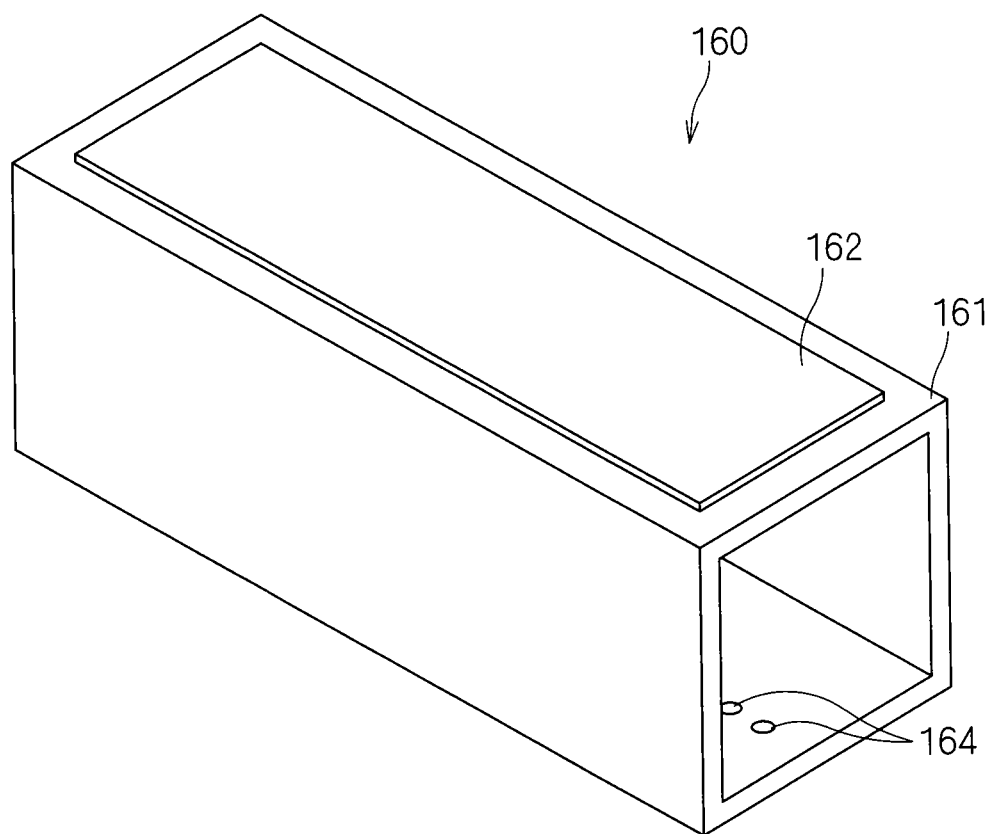
FIG. 12 is a view showing another example of the cleaning nozzle.

In the above-mentioned embodiment, the droplets of the cleaning liquid are discharged from the cleaning nozzle 60 of the cylindrical shape under the above-mentioned discharge conditions. However, the configuration of the cleaning nozzle 60 is not limited to this. FIG. 12 is a view showing another example of the cleaning nozzle.

A cleaning nozzle 160 shown in FIG. 12 is configured such that a piezoelectric element 162 is affixed to a tubular body 161 having the shape of a quadrangular prism. The tubular body 161 has an outside shape of a quadrangular prism, and includes a hollow interior space having the shape of a quadrangular prism. The opposite ends of the hollow space of the tubular body 161 are both open. As in the above-mentioned embodiment, a first end of the hollow space of the tubular body 161 is connected to the supply pipe 70, and a second end thereof is connected to the delivery pipe 75 (with reference to FIG. 2). The tubular body 161 may be made of quartz or ceramics such as zirconia.

The tubular body 161 has a plurality of (for example, 20) discharge holes 164 formed in a first side wall surface thereof. The 20 discharge holes 164 are arranged in a line in a longitudinal direction of the tubular body 161. The size of the plurality of discharge holes 164 and the spacing therebetween are identical with the size of the plurality of discharge holes 64 of the above-mentioned embodiment and the spacing therebetween, respectively. The first side wall surface formed with the plurality of discharge holes 164 has a width of 10 mm. The piezoelectric element 162 is affixed to the outside wall surface of a second side wall (a side wall opposed to the side wall provided with the plurality of discharge holes 164) of the tubular body 161. The piezoelectric element 162 is electrically connected to the power supply 65. The power supply 65 applies an alternating voltage having a predetermined frequency to the piezoelectric element 162.

The overall construction of the substrate cleaning apparatus including the cleaning nozzle 160 and the construction around the cleaning nozzle 160 are identical with those of the above-mentioned embodiment. The cleaning liquid always continues to be fed to the cleaning nozzle 160. When the cleaning process is performed, the valve 76 is closed, whereby the cleaning liquid is discharged from the plurality of discharge holes 164. Also, when the cleaning process is performed, the piezoelectric element 162 applies vibrations to the cleaning liquid within the tubular body 161. Thus, droplets of the cleaning liquid are produced and discharged from the plurality of discharge holes 164, as in the above-mentioned embodiment.

Figure 13:
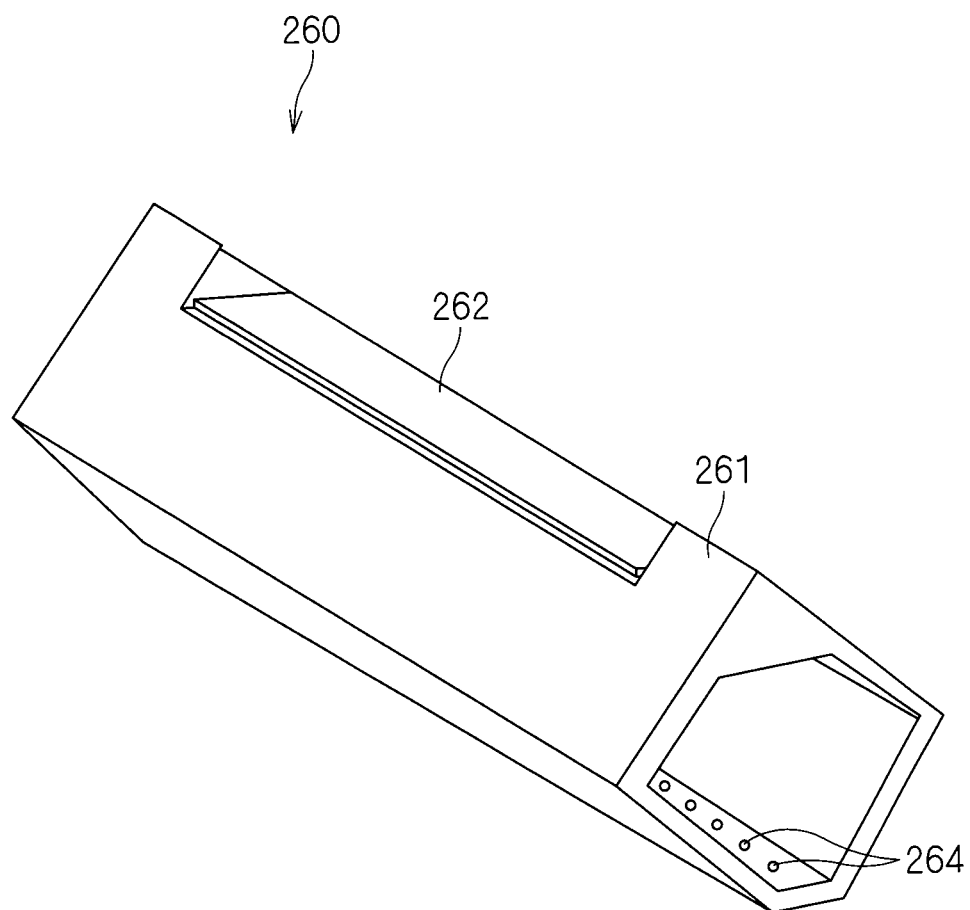
FIG. 13 is a view showing another example of the cleaning nozzle.

The cleaning nozzle may be configured as shown in FIG. 13. A cleaning nozzle 260 shown in FIG. 13 includes a tubular body 261 having the shape of a polygonal prism. The tubular body 261 has an outside shape of a polygonal prism, and includes a hollow interior space having the shape of a polygonal prism. The opposite ends of the hollow space of the tubular body 261 are both open. As in the above-mentioned embodiment, a first end of the hollow space of the tubular body 261 is connected to the supply pipe 70, and a second end thereof is connected to the delivery pipe 75 (with reference to FIG. 2). The tubular body 261 may be made of quartz or ceramics such as zirconia.

The tubular body 261 has a plurality of (for example, 20) discharge holes 264 formed in a first side wall surface thereof and arranged in a line. The size of the plurality of discharge holes 264 and the spacing therebetween are identical with the size of the plurality of discharge holes 64 of the above-mentioned embodiment and the spacing therebetween, respectively. A piezoelectric element 262 is affixed to the outside wall surface of a side wall opposed to the side wall provided with the plurality of discharge holes 264. The piezoelectric element 262 is electrically connected to the power supply 65.

The overall construction of the substrate cleaning apparatus including the cleaning nozzle 260 and the construction around the cleaning nozzle 260 are identical with those of the above-mentioned embodiment. The cleaning liquid always continues to be fed to the cleaning nozzle 260. When the cleaning process is performed, the valve 76 is closed, whereby the cleaning liquid is discharged from the plurality of discharge holes 264. Also, when the cleaning process is performed, the piezoelectric element 262 applies vibrations to the cleaning liquid within the tubular body 261. Thus, droplets of the cleaning liquid are produced and discharged from the plurality of discharge holes 264, as in the above-mentioned embodiment.

Figure 14A:
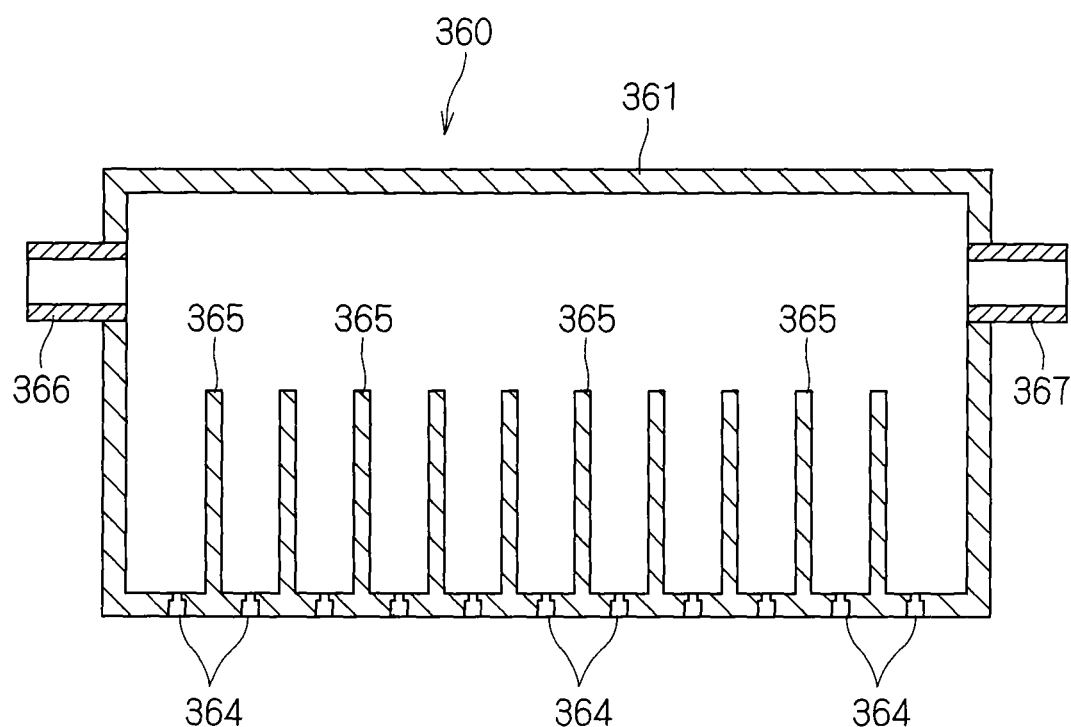
FIG. 14A and FIG. 14B are views showing other examples of the cleaning nozzle.
Figure 14B:
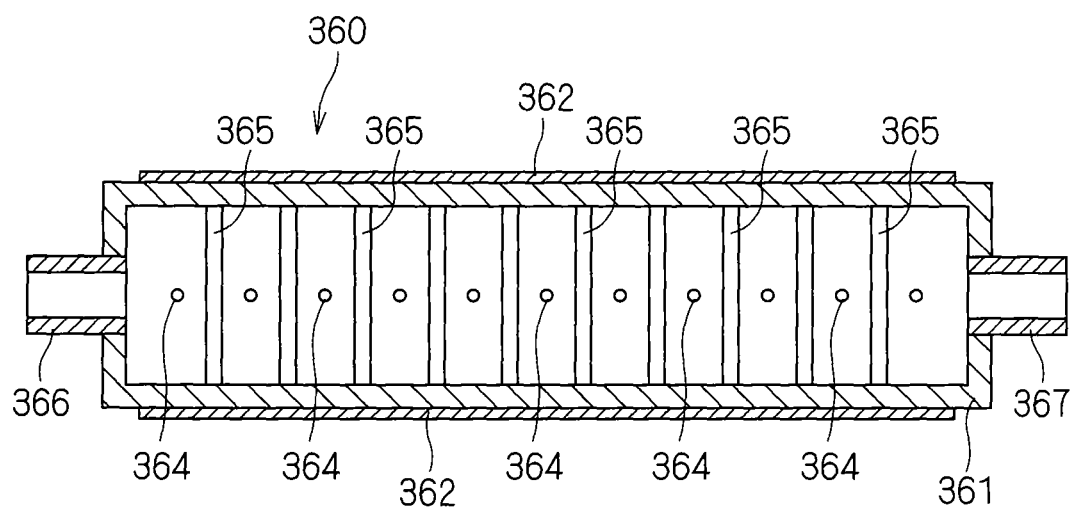

The cleaning nozzle may also be configured as shown in FIGS. 14A and 14B. FIG. 14A is a vertical sectional view of a cleaning nozzle 360, and FIG. 14B is a transverse sectional view of the cleaning nozzle 360. The cleaning nozzle 360 shown in FIGS. 14A and 14B includes a tubular body 361 having the shape of a rectangular parallelepiped. The interior space of the tubular body 361 is divided into a plurality of compartments by a plurality of partition plates 365. The partition plates 365 do not completely separate the plurality of compartments, but the compartments are in communication with each other.

The tubular body 361 is formed with an inlet 366 and an outlet 367. The inlet 366 and the outlet 367 are in communication with the interior space of the tubular body 361. The inlet 366 is connected to the supply pipe 70, and the outlet 367 is connected to the delivery pipe 75. The tubular body 361 may also be made of quartz or ceramics such as zirconia.

Each of the compartments separated by the plurality of partition plates 365 has a discharge hole 364. The plurality of discharge holes 364 in the cleaning nozzle 360 are also arranged in a line. The size of the plurality of discharge holes 364 and the spacing therebetween are identical with the size of the plurality of discharge holes 64 of the above-mentioned embodiment and the spacing therebetween, respectively. A piezoelectric element 362 is affixed to the outside surfaces of opposite side walls of the tubular body 361. The piezoelectric element 362 is electrically connected to the power supply 65.

The overall construction of the substrate cleaning apparatus including the cleaning nozzle 360 and the construction around the cleaning nozzle 360 are identical with those of the above-mentioned embodiment. The cleaning liquid always continues to be fed to the cleaning nozzle 360. When the cleaning process is performed, the valve 76 is closed, whereby the cleaning liquid is discharged from the plurality of discharge holes 364. Also, when the cleaning process is performed, the piezoelectric element 362 applies vibrations to the cleaning liquid within the tubular body 361. Thus, droplets of the cleaning liquid are produced and discharged from the plurality of discharge holes 364, as in the above-mentioned embodiment.

For the discharge of the droplets of the cleaning liquid toward the substrate W by using the cleaning nozzle 160 shown in FIG. 12, the cleaning nozzle 260 shown in FIG. 13 or the cleaning nozzle 360 shown in FIGS. 14A and 14B, the discharge conditions of the droplets are similar to those described above. Discharging the droplets of the cleaning liquid toward the substrate W while satisfying the above-mentioned discharge conditions eliminates useless droplets not contributing to the cleaning and harmful droplets that cause damages to the substrate W to improve the cleaning efficiency without damages to the substrate W, thereby attaining the sufficient removal rate of contaminants in a short time, as in the above-mentioned embodiment.

Cleaning nozzles other than those shown in FIGS. 2, 3, and 12 to 14 which are capable of discharging droplets of the cleaning liquid under the above-mentioned discharge conditions may be used to discharge droplets of the cleaning liquid toward the substrate W.

The cleaning liquid is not limited to deionized water but may be an aqueous solution of liquid chemical for cleaning.

The overall construction of the substrate cleaning apparatus 1 is not limited to the configuration shown in FIG. 1. For example, the substrate cleaning apparatus 1 may be provided with a gas nozzle for ejecting a nitrogen gas toward the substrate W subjected to the cleaning process to dry the substrate W.

The invention claimed is:

1. A substrate cleaning method for cleaning a semiconductor substrate supported by a rotary holding part from below, by discharging droplets of a cleaning liquid toward an upper surface of the semiconductor substrate, including the steps of:

feeding the cleaning liquid constantly and continuously by a pressure pump to an interior space of a tubular body including a plurality of discharge holes having a uniform diameter formed in a wall surface of said tubular body, said discharge holes extending in a row at a regular pitch along said wall surface from an opening at one end of the interior space of the tubular body on an upstream side of the tubular body to a draining end of the interior space of said tubular body on a downstream side of the tubular body, said discharge holes being arranged to face the semiconductor substrate;

draining said cleaning liquid being fed to the interior space of said tubular body through a drainage pipe by opening a valve provided at said draining end of the interior space of said tubular body;

increasing a liquid pressure of said cleaning liquid within the interior space of said tubular body while feeding the cleaning liquid to the interior space of the tubular body by closing said valve;

dividing the cleaning liquid flowing out of the plurality of discharge holes under liquid pressure by repeatedly expanding and contracting a piezoelectric element affixed to an outside wall surface opposed to the wall surface provided with the plurality of discharge holes of the tubular body and vibrating, at a predetermined frequency, the cleaning liquid with an increased liquid pressure in the interior space of the tubular body; and discharging droplets of the cleaning liquid from said plurality of discharge holes toward the semiconductor substrate that is being rotated around a rotary shaft along a vertical direction within a horizontal plane by the rotary holding part, the droplets of the cleaning liquid having an average droplet diameter in the range from 15 to 30 µm and a droplet diameter distribution value defined by 3 $\sigma_1$, (where $\sigma_1$ is a standard deviation of the droplet diameters) that does not exceed 2 µm.

2. The substrate cleaning method according to claim 1, wherein:

the plurality of discharge holes are arranged in a line in a longitudinal direction of the tubular body so that a spacing between the plurality of discharge holes is 1 mm, and the plurality of discharge holes have a diameter in the range from 7 µm to 12 µm.

3. The substrate cleaning method according to claim 1, wherein:

the pressure pump feeds the cleaning liquid so that the liquid pressure of the cleaning liquid in the interior space of the tubular body is maintained at a pressure within a predetermined range.

4. The substrate cleaning method according to claim 3, wherein:

the liquid pressure in the interior space of the tubular body is not greater than 10 MPa.

* * * * *